United States Patent [19]
Mukai

[11] Patent Number: 5,120,394
[45] Date of Patent: Jun. 9, 1992

[54] EPITAXIAL GROWTH PROCESS AND GROWING APPARATUS

[75] Inventor: Ryoichi Mukai, Kawasaki, Japan
[73] Assignee: Fujitsu Limited, Kanagawa, Japan
[21] Appl. No.: 433,824
[22] Filed: Nov. 9, 1989

[30] Foreign Application Priority Data

Nov. 11, 1988 [JP] Japan .................. 63-283895
Mar. 17, 1989 [JP] Japan .................. 1-063872

[51] Int. Cl.$^5$ ............................................ C30B 25/18
[52] U.S. Cl. ........................................ 156/610; 156/612; 156/613; 156/614; 148/DIG. 17; 437/19; 437/939; 437/963
[58] Field of Search .................. 148/DIG. 1, 2, 4, 17, 148/41, 22, 48, 93; 156/610–614; 427/53.1, 54.1, 248.1; 437/19, 81, 87, 95, 173, 939, 946, 949, 963

[56] References Cited

U.S. PATENT DOCUMENTS

| | | | |
|---|---|---|---|
| 4,605,479 | 8/1986 | Faith, Jr. | 204/192.17 |
| 4,649,059 | 3/1987 | Eden et al. | 427/53.1 |
| 4,723,508 | 2/1988 | Yamazaki et al. | 427/38 |
| 4,786,352 | 11/1988 | Benzing | 204/298.34 |
| 4,800,173 | 1/1989 | Kanai et al. | 437/173 |
| 4,843,030 | 6/1989 | Eden et al. | 437/173 |
| 4,942,058 | 7/1990 | Sano | 156/612 |

FOREIGN PATENT DOCUMENTS

| | | | |
|---|---|---|---|
| 0219728 | 11/1985 | Japan | 437/173 |
| 0219729 | 11/1985 | Japan | 427/53.1 |
| 0219732 | 11/1985 | Japan | 427/53.1 |
| 0219736 | 11/1985 | Japan | 437/173 |
| 0219737 | 11/1985 | Japan | 437/173 |

OTHER PUBLICATIONS

"Photochemical Vapor Deposition of Single-Crystal Silicon at a Very Low Temperature of 200° C.", Yamada et al., Extended Abstracts of the 18th (1986 International) Conference on Solid State Devices and Materials, Tokyo, 1986, pp. 217–220.

"Photochemical Effects for Low-Temperature Si Epitaxy", T. Yamazaki et al., Extended Abstracts of the 18th (1986 International) Conference on Solid State Devices and Materials, Tokyo, 1986, pp. 213–216.

"Thin Film Formation by Radical Jet Generated by UV Laser-Induced Multi-Photon Dissociation", Y. Ichikawa et al., Extended Abstracts of the 18th (1986 International) Conference on Solid State Devices and Materials, Tokyo, 1986, pp. 221–224.

Primary Examiner—Robert Kunemund
Attorney, Agent, or Firm—Armstrong, Nikaido, Marmelstein, Kubovcik & Murray

[57] ABSTRACT

A process of epitaxially growing a semiconductor Si, Ge or SiGe single crystal layer on a semiconductor (Si or Ge) single crystal substrate, comprising the steps of: allowing a raw material gas (e.g., $Si_2H_6$, $GeH_4$) for the layer and a fluoride gas (e.g., $Si_2F_6$, $GeF_4$, BF) of at least one element selected from the group consisting of the semiconductor element of the layer and a dopant for the layer to simultaneously flow over the substrate; and applying an ultraviolet light to the substrate to decompose the gases by an ultraviolet light excitation reaction to deposit the layer on the surface of the substrate heated at a temperature of from 250° to 400° C.

Prior to the epitaxial growth of the semiconductor layer, the substrate is cleaned by allowing the fluoride gas to flow over the substrate having a temperature of from a room temperature to 500° C., and by irradiating an ultraviolet light to the substrate to remove a natural oxide layer from the substrate surface.

10 Claims, 2 Drawing Sheets

EPITAXIAL GROWTH PROCESS AND GROWING APPARATUS

BACKGROUND OF THE INVENTION

1. Field of the Invention

The present invention relates to an epitaxial growing of a semiconductor single crystal layer, and more particularly, to a process of forming an epitaxially grown layer on a single crystal silicon substrate by photo-decomposing a gas raw material with an irradiation of ultraviolet laser light or lamp light, and an apparatus for carrying out the process. The present invention is applied to an epitaxial growth of a silicon (Si), germanium (Ge) or silicon-germanium (SiGe) single crystal layer (thin film).

2. Description of the Related Art

In a production of semiconductor devices such as bipolar transistors and MOS field effect transistors (FETs), an epitaxial growth temperature must be lowered when growing a single crystal epitaxial layer of Si, Ge or SiGe, to avoid the generation of lattice defects, and variations in the impurity diffusion profile in a single crystal (e.g., Si) substrate (wafer), to enable the miniaturization of a semiconductor device, such as a very-large-scale integration (VLSI) device.

Recently, instead of a thermal decomposition (hydrogen reduction) process having a growing temperature of 950° C. or more, a photo CVD process using a photo-exciting reaction has been proposed for an expitaxial growth at a temperature lower than the above-mentioned CVD processes. In this case, the epitaxial growth of, e.g., Si, is performed at a temperature of from 600° to 900° C. The photo CVD process however, requires a high temperature annealing treatment (at 900° C. or more) in an ultrahigh vacuum or a hydrogen atmosphere, for removing (cleaning) a natural oxide layer formed on the substrate surface prior to the epitaxial growth, and requires an addition of hydrogen gas to prevent the formation of an oxide layer during the epitaxial growth.

When the high temperature annealing treatment for removing the natural oxide layer is applied to a substrate in which impurity doped (diffused) regions have been formed, the regions (i.e., diffusion profiles) are undesirably expanded. Since the use of hydrogen gas is potentially dangerous (e.g., an explosion could occur) in the operation of an epitaxial growth apparatus, it is preferable to avoid the use of hydrogen gas.

To avoid the high temperature annealing treatment, it has been proposed that $SiH_2F_2$ gas be added in the hydrogen gas to generate SiF radicals therefrom at a low temperature of 100° to 300° C., as these radicals accelerate the removal of the natural oxide layer. Furthermore, the addition of $SiH_2F_2$ gas to the gas raw material generates SiF radicals which prevent the formation of the oxide layer during the epitaxial growth (cf. e.g., A. Yamada et al., Extended Abstracts of the 18th Conference on Solid State Devices and Materials, Tokyo, 1986, pp. 217-220). $SiH_2F_2$ gas, however, has a spontaneous combustion property and is potentially more dangerous than hydrogen, and therefore, it is necessary to avoid the use of $SiH_2F_2$ gas.

SUMMARY OF THE INVENTION

An object of the present invention is to further reduce the epitaxial growth temperature in the photo CVD process, and the cleaning temperature for the substrate surface, by using a safe gas instead of the hydrogen gas and $SiH_2F_2$ gas.

Another object of the present invention is to provide an improved process of epitaxially growing a semiconductor (Si, Ge or SiGe) single crystal layer (thin film) by a photo CVD process at a temperature lower than used in a conventional photo CVD process.

Still another object of the present invention is to provide an apparatus for carrying out the improved epitaxial growth process.

The above-mentioned and other objects of the present invention are attained by providing a process of epitaxially growing a semiconductor single crystal layer on a semiconductor single crystal substrate, comprising the steps of: allowing a raw material (hydride) gas for said layer and a fluoride gas of at least one element selected from the group consisting of the semiconductor element of said layer and a dopant for said layer to simultaneously flow over said substrate; and applying an ultraviolet light to said substrate to decompose said gases by an ultraviolet light excitation reaction to deposit said layer on the surface of said substrate heated at a temperature of from 250° to 400° C.

The semiconductor single crystal layer to be epitaxially grown is of Si, Ge or SiGe and is deposited on a semiconductor single crystal substrate of Si or Ge.

Preferably the raw material hydride gas for the grown layer is of silicon hydride $[Si_nH_{2n+2}(n=2, 3, 4)]$ for the Si layer or is of germanium hydride $[Ge_nH_{2n+2} (n=1, 2, 3)]$ for the Ge layer. It is possible to use a gas mixture of the silicon hydride gas and the germanium hydride gas as the raw material hydride gas for the SiGe layer.

It is preferable to use at least one fluoride gas of silicon fluoride (and/or germanium fluoride), boron fluoride, arsenic fluoride, and phosphorus fluoride. Note, where the Si epitaxial layer is grown, the germanium fluoride gas should not be used, and where the Ge epitaxial layer is grown, the silicon fluoride gas should not be used.

When the ultraviolet light irradiates the silicon hydride gas (and/or germanium hydride gas), the gas is decomposed to deposit Si (and/or Ge) on the Si or Ge substrate, with the result that the Si (and/or Ge) layer is epitaxially grown. When the ultraviolet light irradiates the fluoride gas of Si, Ge, B, As and/or P, the gas is decomposed to generate fluoride radicals of SiF, GeF, BF, AsF and/or PF which remove oxide to the inclusion of the oxide in the growing layer during the epitaxial growth period. This oxide is usually generated by a reaction with oxygen remaining within a reactor and is diffused through walls of the reactor and other parts of the apparatus. Furthermore, the fluoride radicals can be decomposed to generate elements of Si, Ge, B, As and P. The elements of Si and Ge contribute to the growth of the epitaxial layer, and the elements of B, As and P are contained in the epitaxial layer and serve as dopants for determining the conductivity type.

The addition of the fluoride gas in the raw material gas in the photo CVD process for epitaxial growth enables the epitaxial temperature to be made lower than that used in a conventional photo CVD process.

Prior to the above-mentioned epitaxial growth of the Si, Ge or SiGe layer, the surface of the semiconductor single crystal substrate should be cleaned, i.e., a natural oxide layer formed on the substrate surface should be removed (etched out) by allowing the above-mentioned fluoride gas to flow over the substrate kept at a temperature of from a room temperature to 500° C. and by irradiating the ultraviolet light onto the fluoride gas to decompose the gas by to a photoexitation. Namely, the decomposition of the fluoride gas generates the fluoride radicals which remove (etch) the natural oxide layer. The silicon fluoride (SiF, $Si_2F_6$) gas, germanium fluoride (GeF) gas, boron ($BF_3$) gas, arsenic fluoride ($AsF_3$, $AsF_5$) gas, and fluoride ($PF_3$, $PF_5$) gas used instead of the $SiH_2F_2$ gas are incombustible, and thus are safer than the $SiH_2F_2$ gas. The germanium fluoride gas should not be used, prior to the epitaxial growth of the Si layer, and the silicon fluoride gas should not be used prior to the epitaxial growth of the Ge layer.

Preferably, the ultraviolet light has a wavelength of from 250 to 150 nm, suitable for photoexciting the above-mentioned gases, and is irradiated by a laser or a high pressure mercury lamp.

According to the present invention, the fluoride radicals such as SiF radicals are utilized in the epitaxial growth and the cleaning of the substrate surface. If the radical generation is interrupted, between the cleaning step and the epitaxial growth step, a natural oxide layer may be formed on the substrate to prevent the epitaxial growth. Therefore, in practice, such an interruption must be avoided by continuously feeding the fluoride gas and by adding the raw material hydride gas to the flowing fluoride gas during the epitaxial growth period. Since, however, the gas flow rate is usually controlled by a mass flow controller, several seconds must pass before reaching a preset value of the flow rate, from the start of the flow of the raw material hydride gas. Taking this time-lag into consideration, the raw material hydride gas is fed at a flow rate larger than the preset value for several seconds from the start of the flow, and as a result, the deposition rate of the semiconductor single crystal layer may be temporarily increased: in the worst case, the epitaxial growth may be hampered.

Another object of the present invention is to provide an epitaxial growth apparatus by which a procedure from the substrate surface cleaning to the photo CVD epitaxial growth is stably carried out without difficulty.

The above-mentioned object is attained by providing an apparatus for epitaxially growing a semiconductor single crystal layer on a semiconductor single crystal substrate, comprising a reactor having a susceptor for said substrate and a window allowing a passage of ultraviolet light; an ultraviolet light source; a first inlet pipe for feeding a fluoride gas, which pipe is provided with a spray end portion thereof located above and close to the substrate; a second inlet pipe for feeding a raw material gas for the layer, which pipe is branched into a first branch pipe having a first valve and joined to said first inlet pipe, and a second branch pipe having a second valve and introduced into a region within the reactor not irradiated with the ultraviolet light.

In the apparatus, the spray end portion for feeding the gases used for the cleaning and the epitaxial growth is placed above and close to the substrate, to generate a slight pressure difference between that in the vicinity of the substrate and other regions within the reactor chamber.

During the cleaning and epitaxial growth processes, the raw material gas is first fed into the not irradiated region to adjust and stabilize the flow rate thereof, and is then fed to the close vicinity of the substrate together with the fluoride gas, by closing the second valve and simultaneously opening the first valve, whereby a stable photo CVD epitaxial growth is realized.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figure 1:
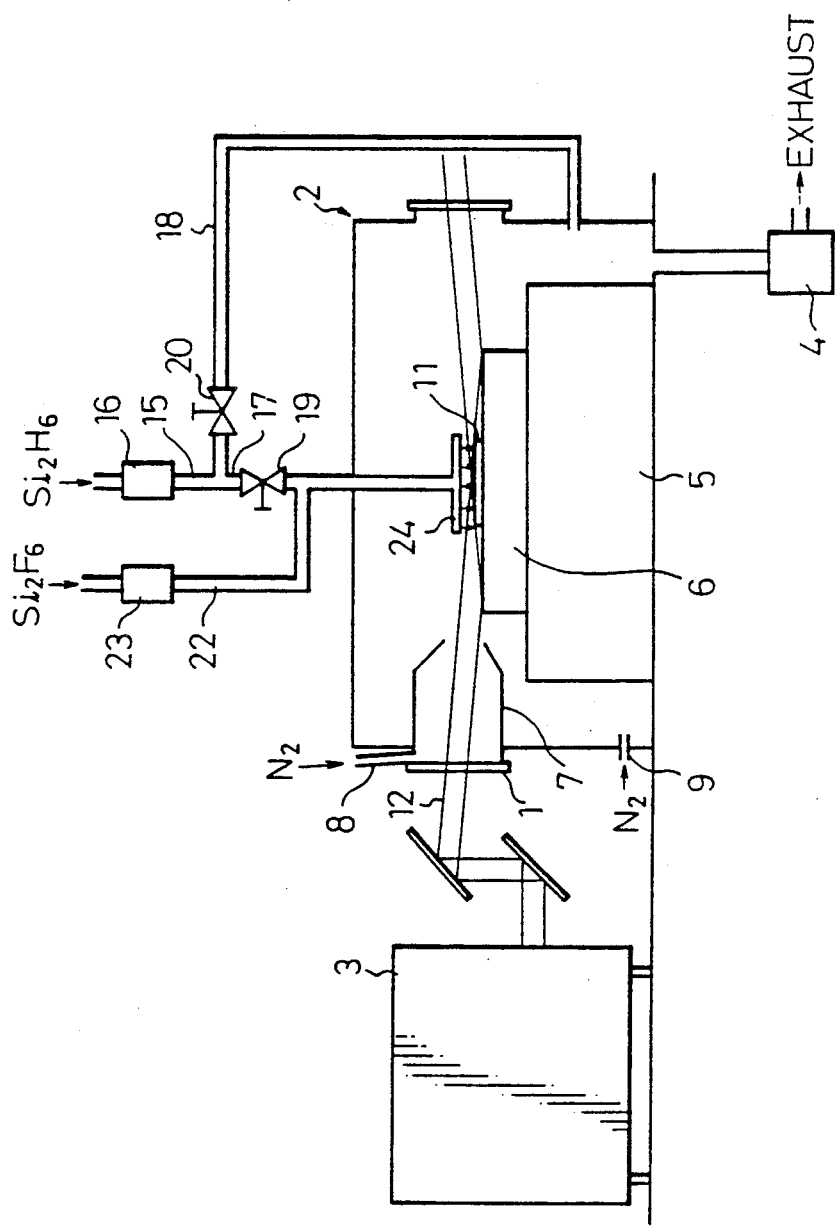
FIG. 1 is a schematic view of an epitaxial growth apparatus in a photo CVD system according to the present invention.

Referring to FIG. 1, an epitaxial growth apparatus having an improved pipeline system is used for epitaxially growing (depositing, forming) a semiconductor single crystalline layer on an semiconductor single crystal substrate by utilizing a photoexcitation reaction caused by an ultraviolet irradiation in accordance with the present invention.

The apparatus comprises a vacuum reactor chamber 2 with a transparent window 1 allowing a passage of ultraviolet light 12, and an ultraviolet light generator 3 (e.g., ArF excimer laser, a light pressure mercury lamp or the like). The reactor chamber 2 is communicated to a vacuum exhaust system (e.g., vacuum pump) 4 and is provided with an X-Y stage 5, a heating susceptor 6, and a pipe guide 7 for the ultraviolet light within the chamber 2. Gas inlet pipes 8 and 9 for feeding an inert gas (e.g., nitrogen ($N_2$) gas) are fixed to the reactor chamber 2. A first inlet pipe 22 for feeding a fluoride gas (e.g., $Si_2F_6$, GeF, BF or the like) and having a mass flow controller 23 is set such that a spray end portion 24 thereof is located above and close to a semiconductor substrate (wafer) 11 set on the susceptor 6. The spray end portion 24 is provided with spraying pores distributed in a space corresponding to the size of the substrate 11 and arranged at a position at which it will not obstruct the ultraviolet irradiation. A second inlet pipe 15 for feeding a material hydride gas (e.g., $Si_2H_6$, GeH) is provided with a mass flow controller 16 and is branched, downstream of the controller 16, in a first branch pipe 17 with a first valve 19 and a second branch pipe 18 with a second valve 20. The first branch pipe 17 is joined to the first inlet pipe 22, to spray the hydride gas together with the fluoride gas through the spray end portion 24. The end portion of the second branch pipe 18 is open in a region within the reactor chamber 2 not irradiated with the ultraviolet light, to provide a bypass feed of the hydride gas into the reactor chamber 2.

EXAMPLE 1

According to the process of the present invention, a Si single crystalline layer is formed on a Si single crystalline substrate 11 in the following manner.

First, the Si substrate 11 is placed on the heating susceptor 6, the reactor chamber 2 is then exhausted by the vacuum exhaust system 4 to generate a vacuum and pressure of approximately $1 \times 10^{-6}$ Torr, and nitrogen ($N_2$) gas having a flow rate of 10 SCCM is continuously introduced into the reaction chamber 2 through the pipes 8 and 9 to form an inert gas atmosphere having a pressure of 4 Torr.

The Si substrate 11 is heated and kept at a temperature of 400° C. and silicon fluoride ($Si_2F_6$) gas is continuously fed at a flow rate of 15 SCCM through the first inlet pipe 22 and the spray end portion 24. Under the above-mentioned conditions, an ArF excimer laser device 4 as the ultraviolet light generator irradiates a laser ray (wavelength: 193 nm) 12 over the whole surface of the Si substrate 11 through a transparent window 1. The laser irradiation is performed for 10 minutes to etch (remove) a natural oxide layer formed on the Si substrate surface by a reduction of SiF radicals generated from the $Si_2F_6$ gas, whereby the surface of the Si substrate 11 is cleaned.

Just before the end of the surface cleaning process, $Si_2H_6$ gas as a raw material gas is passed into a not irradiated region within the reactor chamber 2 through the second branch pipe 18 from the second inlet pipe 15, by opening the second valve 20, at a flow rate of 0.2 SCCM. At this time, since the $Si_2F_6$ gas flows out of the spray end portion 24, the introduced $Si_2H_6$ gas does not flow on the Si substrate 11. When the flow rate of the $Si_2H_6$ gas becomes stable, the second valve 20 is closed, and simultaneously the first valve 19 is opened, to feed the $Si_2H_6$ gas into the first inlet pipe 22 to flow together with the $Si_2F_6$ gas onto the Si substrate 11. When the $Si_2H_6$ gas is irradiated with the ArF excimer laser ray 12 and decomposed by photo excitation, Si is deposited on the cleaned surface of the Si substrate to epitaxially grow a Si single crystal layer thereon. This epitaxial growth of Si after the cleaning forms an Si layer having a thickness of approximately 0.4 μm, in 10 minutes. The single crystallizability of the formed Si layer is confirmed by an electron channeling pattern (ECP) technique. During the epitaxial growth, it is possible to prevent an inclusion of oxide contaminants (particles) generated by a reaction of Si with oxygen diffused out of the walls of the reactor chamber 2 in the growing Si layer, by both the reduction effect of SiF radicals and the direct reduction effect of ultraviolet irradiation on the oxide particles. The SiF radicals are generated not only directly by a photo-decomposition of the ultraviolet light of $Si_2F_6$ gas but also indirectly by the effect of other radicals generated by the photo-decomposition of $Si_2H_6$ gas.

EXAMPLE 2

In the formation process of the Si layer of the above-mentioned Example 1, a Ge single crystal substrate is used instead of the Si single crystal substrate. Namely, the cleaning process and the epitaxial growth process are performed under the same conditions as Example 1, but the semiconductor material of the substrate is different. As a result, an Si single crystal layer is obtained (epitaxially grown).

EXAMPLE 3

In the formation process of the Si layer of the above-mentioned Example 1, a mixture of $Si_2H_6$ gas (50 vol %) and $Si_3H_8$ gas (50 vol %) is used instead of $Si_2H_6$ gas only, as the raw material gas. In this case, the Si single crystal layer is also obtained (epitaxially grown) on the Si substrate.

EXAMPLE 4

In the formation process of the Si layer of Example 1, a boron fluoride ($BF_2$) gas is used instead of the $Si_2F_6$ gas. In this case, the Si single crystal layer is obtained (epitaxially grown) on the Si substrate and contains a boron dopant therein, and thus has a p-type conductivity.

Comparative Example A

An Si layer is formed on a Si single crystal substrate under the same conditions as those of the above-mentioned Example 1 except that the cleaning process is omitted. In this case, the Si substrate is heated at 400° C. and the $Si_2F_6$ gas (15 SCCM) and $Si_2H_6$ gas (0.2 SCCM) are simultaneously fed through the spray end portion 24. Thereafter, the ArF excimer laser ray 12 is irradiated to deposit Si and to form a Si layer on the Si substrate 11. When the formed Si layer was examined by the EPC technique, it was confirmed that the Si layer was not a single crystal layer.

EXAMPLE 5

According to the process of the present invention, a Ge single crystal layer is formed on a Si single crystal substrate by using the apparatus shown in FIG. 1, in the following manner.

First, the Si substrate 11 is placed on the heating susceptor 6, then reactor chamber 2 is the exhausted to reach a pressure of approximately $1 \times 10^6$ Torr, and $N_2$ gas is continuously fed at a flow rate of 10 SCCM into the reaction chamber 2 to form an inert gas atmosphere at a pressure of 4 Torr. The Si substrate 11 is heated and held at a temperature of 250°–400° C., and germanium fluoride ($GeF_4$) gas is continuously fed at a flow rate of 5 SCCM through the spray end portion 24. The ArF laser ray 12 is incident on the Si substrate 11 through the window 1 to remove a natural oxide layer from the Si substrate surface, for 60 minutes.

Next, $GeH_4$ gas (0.1 SCCM) is first fed into a not irradiated region in the reaction chamber 2 through the second branch pipe 18, and then fed into the first inlet pipe 2 to flow $GeH_4$ gas and $GeF_4$ gas over the Si substrate 11 through the spray end portion 24 by controlling the first and second valves 19 and 20, as explained in Example 1. As a result, $GeH_4$ gas is photo-excited to be compressed, and thus Ge is deposited on the cleaned Si substrate surface to epitaxially grow a Ge single crystal layer having a thickness of approximately 10 nm, in 10 minutes. The single crystallinity of the formed Ge layer is conformed by the ECP technique.

EXAMPLE 6

In the formation process of Ge layer of the above-mentioned Example 5, a Ge single crystalline substrate is used instead of the Si substrate. In this case, the Ge single crystal layer is also obtained (epitaxially grown).

Comparative Example B

A Ge layer is formed on the Si substrate under the same conditions as those of Example 4, except that the cleaning process is omitted. In this case, the Si substrate is heated at 250°–400° C., and the $GeF_4$ gas (5 SCCM) and $GeH_4$ gas (0.1 SCCM) are simultaneously fed through the spray end portion 24. Thereafter, the ArF excimer laser ray 12 is irradiated to deposit Ge and form the Ge layer on the Si substrate 11. When the formed Ge layer was examined by the EPC technique, it was confirmed that the Ge layer was not a single crystalline layer.

EXAMPLE 7

According to the process of the present invention, an SiGe single crystal layer is formed on an Si single crystal substrate by using the above-mentioned epitaxial growth apparatus, in the following manner.

The Si substrate 11 is placed on the heating susceptor 6, the reactor chamber 2 is then exhausted, and $N_2$ gas is continuously fed at a flow rate of 10 SCCM into the reactor chamber 2 to form an inert atmosphere at a pressure of 4 Torr. The Si substrate 11 is heated and held at 250°–400° C. and a mixed fluoride gas (5 SCCM) of $Si_2F_6$ gas (50 vol %) and $GeF_4$ gas (50 vol %) is continuously fed through the spray end portion 24. A high pressure mercury lamp (*suitable?) 3 irradiates an ultraviolet light 12 on the Si substrate 11 through the window 1 to remove a natural oxide layer from the Si substrate surface, for 60 minutes.

Next, a mixed hydride gas (5 SCCM) of $Si_2H_6$ gas (50 vol %) and $GeH_4$ gas (50 vol %) is fed into a not irradiated region through the second branch pipe 18 and then fed into the first inlet pipe 22 to pass the mixed gas of the above-mentioned four gases over the Si substrate 11 through the spray end portion 24 by controlling the valves 19 and 20, as explained in Example 1. As a result, the hydride gases are photo-excited to be decomposed, whereby Si and Ge are deposited on the clean Si substrate surface to epitaxially grow the SiGe single crystal layer having a thickness of approximately 10 nm, in 10 minutes. The formed SiGe layer is confirmed by the EPC technique to be a single crystal.

Comparative Example C

A SiGe layer is formed on the Si substrate under the same conditions as those of Example 7 except that the cleaning process is omitted. The formed SiGe layer is examined by the ECP technique to confirm that the SiGe layer is not a single crystal layer.

As mentioned above, the cleaning process of the substrate surface and the epitaxial growth process of the Si, Ge or SiGe layer are performed at a temperature lower than in a conventional case, by using a specific fluoride gas and hydride gas without hydrogen gas and utilizing ultraviolet irradiation to cause a photo-excitation of the gases.

Figure 2:
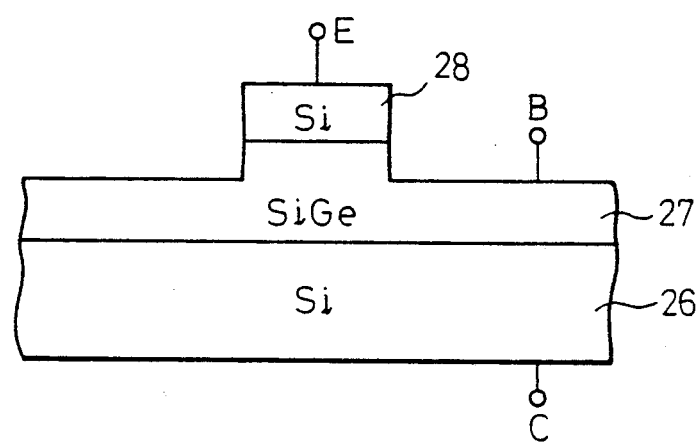
FIG. 2 is a schematic sectional view of a hetero-junction bipolar transistor.
Figure 3:
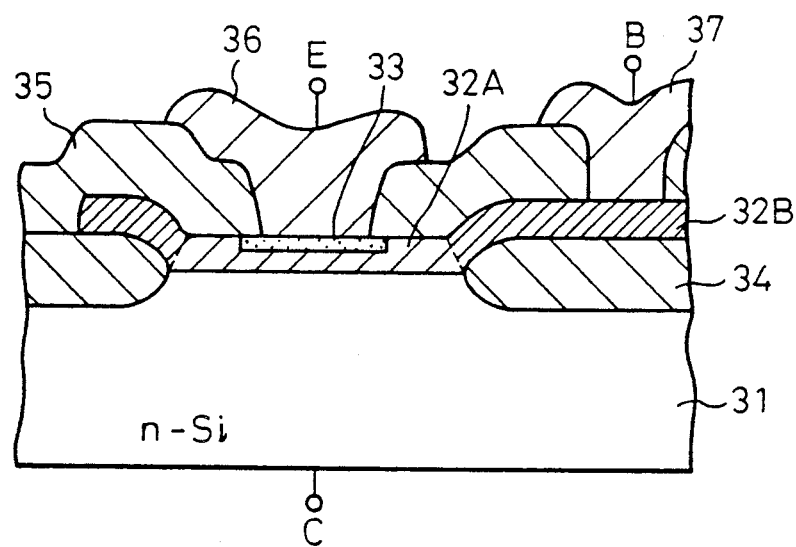
FIG. 3 is a schematic sectional view of another bipolar transistor.

The semiconductor single crystal layer epitaxially grown in accordance with the process of the present invention can be used in semiconductor devices e.g., bipolar transistors, as shown in FIGS. 2 and 3.

In FIG. 2, a hetero-junction bipolar transistor (HBT) comprises an Si single crystal collector 26, an SiGe single crystal base layer 27, and a Si single crystal emitter layer 28. The SiGe layer 27 is epitaxially grown on the Si substrate 26 in a similar manner to that of Example 7, according to the present invention. The Si layer 28 is also epitaxially grown on the SiGe layer 27, by stopping the feeding of the germanium fluoride gas and germanium hydride gas and by continuously feeding the silicon fluoride gas and silicon hydride gas under the ultraviolet light irradiation. After the formation of the Si layer 28, the Si layer 28 and the SiGe layer 27 are selectively etched to form a mesa portion of the Si layer 28 and a portion of the SiGe layer 27, as shown in FIG. 2. Then suitable insulating layers and electrodes are formed in a conventional manner.

In FIG. 3, a bipolar transistor comprises an n-type Si single crystal collector substrate 31, a p-type Si single crystal base layer 32A, and an n-type impurity doped emitter region 33. The Si substrate 31 is selectively and thermally oxidized to form a field oxide ($SiO_2$) layer 34. Then the Si layer 32A is epitaxially grown on the Si substrate 31 in a similar manner to that of Example 1 according to the present invention. In this case, a boron fluoride ($BF_2$) gas is added to the $Si_2F_6$ gas for p-type doping, and at the same time, a Si polycrystal layer 32B is formed on the oxide layer 34. The Si polycrystalline layer 32B is patterned by a conventional sective etching process to form a conductive line for a base electrode. An insulating layer 35 is formed over the whole surface and selectively etched to open an emitter contact hole, and As (or P) ions are doped in the Si layer 32A through the emitter contact hole by an ion-implantation process to form the n-type emitter region 33. The insulating layer 35 is selectively etched to open a base contact hole. Then a metal (Al-Si-Cu alloy) is formed over the whole surface and is patterned to form an emitter electrode 36, a base electrode 37, and a collector electrode indicated by a symbol "C".

It will be obvious that the present invention is not restricted to the above-mentioned embodiments and that many variations are possible for persons skilled in the art without departing from the scope of the invention.

I claim:

1. A process of epitaxially growing a semiconductor single crystal layer on a semiconductor single crystal substrate, comprising the steps of:
   flowing a raw material gas for said layer and a fluoride gas simultaneously over said substrate,
   applying an ultraviolet light to said substrate to decompose said gases by ultraviolet light excitation reaction to deposit said layer on a surface of said substrate,
   wherein prior to said deposition of said layer, cleaning said substrate surface by allowing said fluoride gas to flow over said substrate, and by applying an ultraviolet light to said substrate to decompose said fluoride gas,
   wherein said fluoride gas is one or more selected from the group consisting of silicon fluoride, boron fluoride, arsenic fluoride, and phosphorous fluoride.

2. A process of epitaxially growing a semiconductor single crystal layer on a semiconductor single crystal substrate, comprising the steps of:
   flowing a raw material gas for said layer over said substrate,
   applying an ultraviolet light to said substrate to decompose said gas by ultraviolet light excitation reaction to deposit said layer on a surface of said substrate,
   wherein prior to said deposition of said layer, cleaning said substrate surface by allowing a fluoride gas to flow over said substrate, and by applying an ultraviolet light to said substrate to decompose said fluoride gas, wherein said fluoride gas is one or more selected from the group consisting of silicon fluoride, boron fluoride, arsenic fluoride, and phosphorous fluoride.

3. A process according to claim 2, wherein said substrate is heated at a temperature of from 250°–400° C.

4. A process according to claim 2, wherein said semiconductor single crystal substrate is an element selected from the group consisting of silicon and germanium.

5. A process according to claim 2, wherein said semiconductor single crystal layer is silicon.

6. A process according to claim 5, wherein said raw material gas is silicon hydride:

$$Si_nH_{2n+2} (n=2,3,4)$$

7. A process according to claim 6, wherein said silicon hydride is disilane, trisilane, or tetrasilane.

8. A process according to claim 2, wherein said substrate is kept at a temperature of from a room temperature to 500° C.

9. A process according to claim 2, wherein said ultraviolet light has a wavelength of from 250–150 nm.

10. A process according to claim 9, wherein said ultraviolet light is irradiated from a laser.

* * * * *